United States Patent [19]
Deacon

[11] 3,984,791
[45] Oct. 5, 1976

[54] ACOUSTIC SURFACE WAVE FILTERS HAVING BIFURCATED MEMBERS WITH CONNECTING LINKS

[75] Inventor: John Maxwell Deacon, Towcester, England

[73] Assignee: Plessey Handel und Investments A.G., Zug, Switzerland

[22] Filed: June 24, 1975

[21] Appl. No.: 589,852

[30] Foreign Application Priority Data
Feb. 7, 1974 United Kingdom............... 29190/74

[52] U.S. Cl. ............................... 333/72; 29/25.35; 310/9.7; 310/9.8; 333/30 R
[51] Int. Cl.² ...................... H03H 9/04; H03H 9/30
[58] Field of Search ..................... 333/30 R, 72, 76; 310/8, 8.1, 8.2, 9.7, 9.8; 29/25.35

[56] References Cited
UNITED STATES PATENTS
3,727,155  4/1973  DeVries ......................... 310/9.7 X
3,768,032  10/1973  Mitchell ........................... 333/30 R

*Primary Examiner*—Eugene La Roche
*Attorney, Agent, or Firm*—Fleit & Jacobson

[57] ABSTRACT

An acoustic surface wave filter which includes a strip member of a piezoelectric material having input and output interdigital transducers formed on a major surface thereof, each of the interdigital transducers including two interlaced rows of parallel spaced-apart elongated members, each of the elongated members of at least one of the rows being bifurcated to provide two parallel limbs, the limbs of each of the bifurcated members being connected together by means of at least one connecting link.

8 Claims, 6 Drawing Figures

U.S. Patent  Oct. 5, 1976  3,984,791

ACOUSTIC SURFACE WAVE FILTERS HAVING BIFURCATED MEMBERS WITH CONNECTING LINKS

The invention relates to acoustic surface wave filters.

The invention provides an acoustic surface wave filter which includes a strip member of a piezoelectric material having input and output interdigital transducers formed on a major surface thereof, each of the interdigital transducers including two interlaced rows of parallel spaced-apart elongated members, each of the elongated members of at least one of the rows being bifurcated to provide two parallel limbs, the limbs of each of the bifurcated members being connected together by means of at least one connecting link. The connecting links can be of any desired shape and configuration and can be connected between the free ends of the bifurcated limbs or at any position along the length thereof.

Figure 1:
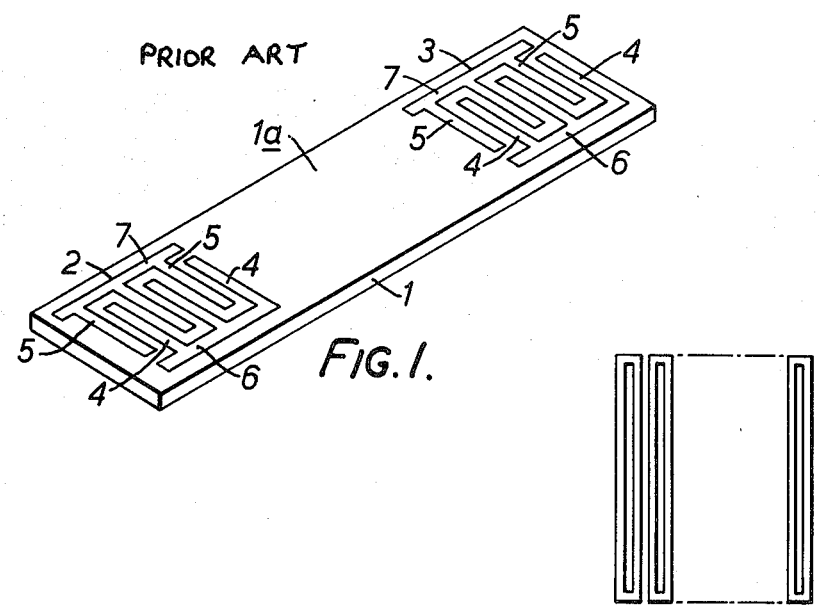
Figure 6:
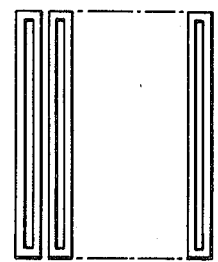
Figure 2:
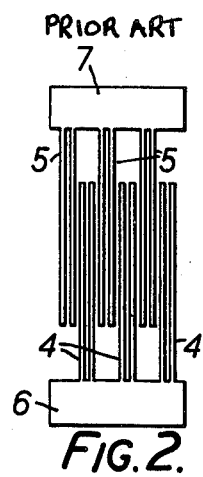
Figure 3:
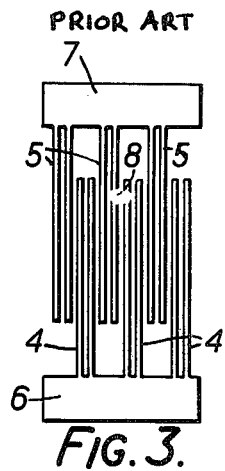
Figure 5:
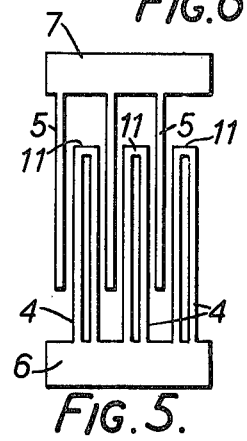
Figure 4:
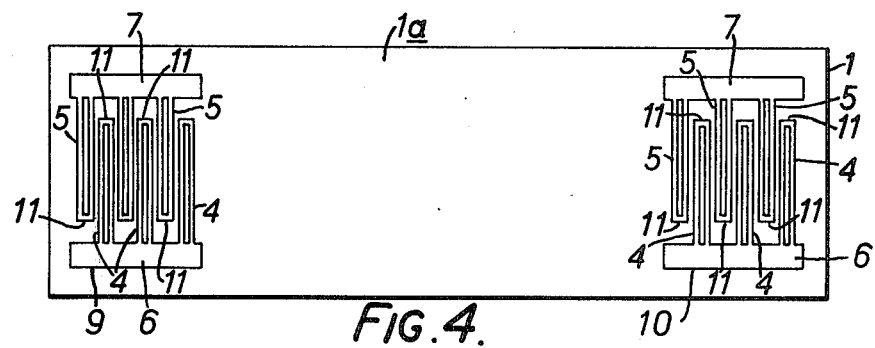

The foregoing and other features according to the invention will be better understood from the following description with reference to the accompanying drawings in which:

FIG. 1 diagrammatically illustrates in a pictorial view a known acoustic surface wave filter, FIGS. 2 and 3 diagrammatically illustrate a known interdigital transducer arrangement for an acoustic surface wave filter, FIG. 4 diagrammatically illustrates in a plan view one arrangement for an acoustic surface wave filter according to the present invention, FIG. 5 diagrammatically illustrates in a plan view an alternative arrangement for the interdigital transducers of FIG. 4, and FIG. 6 diagrammatically illustrates in a plan view a multistrip coupler for an acoustic surface wave filter.

Referring to FIG. 1 of the drawings, the acoustic surface wave filter diagrammatically illustrated therein in a pictorial view includes a strip member 1 of a piezoelectric material such as quartz having conventional input and output interdigital transducers 2 and 3 formed on a surface 1a thereof.

Each of the interdigital transducers includes two interlaced rows of parallel spaced-apart elongated members or fingers 4 and 5 which form an interdigital grid. The fingers 4 are connected together by means of a connecting member 6 and the fingers 5 are connected together by means of a connecting member 7.

The surface wave energy which is generated, in a well known manner, within the surface 1a of the member 1 when an input voltage signal of radio frequency is applied across the connecting members 6 and 7 of the input transducer 2, propagates along the surface and is detected, in a well known manner, by the output transducer 3.

A particularly important unwanted effect in the known acoustic surface wave filter of FIG. 1 is a phenomenon known as "triple transit" echo. The triple transit echo phenomenon refers to the surface wave energy which propagates along the surface 1a of the layer 1 from the input transducer 2 to the output transducer 3 and which is firstly reflected by the output transducer 3 and is then reflected by the input transducer 2 before finally being detected at the output transducer 3. This phenomenon gives rise to an interfering output signal which is delayed in time with respect to the main signal by an amount that is equal to twice the acoustic transit time of the surface wave energy between the input and output transducers. In many applications, for example bandpass filters, it is necessary for the triple transit echo to be suppressed in order to ensure the proper working of the filter.

It is known that the above-mentioned phenomenon can be suppressed by using the interdigital transducer arrangement which is diagrammatically illustrated in a plan view in FIG. 2 of the drawings for the input and output transducers of the acoustic surface wave filter. With this transducer structure which is a modified arrangement of the transducers, according to FIG. 1, each of the elongated members or fingers 4 and 5 are bifurcated to provide two parallel limbs for each of the fingers.

With the transducer structure of FIG. 1 the reflected signals from adjacent fingers 4 and 5 are in phase at the resonant frequency, whereas with the bifurcated or double finger structure of FIG. 2 the reflected signals are 180° out of phase. This is because the spacing between the interdigital members is halved whilst the periodicity of the polarity of the interdigit members is maintained.

A disadvantage of replacing the single finger structure of FIG. 1 with the double finger equivalent of FIG. 2 is that finger widths are halved thereby effecting a reduction in the yield that can be expected in the production of the filters of this type. As is illustrated in FIG. 3 of the drawings in a plan view, the most common fault which occurs in the production of these filters is the breaking of one or more fingers by voids, such as the void 8. The effect of faults such as these is a reduction in the generation or detection capability of the finger or fingers with the result that the response of the filter is degraded.

In one arrangement for an acoustic surface wave filter according to the present invention which is diagrammatically illustrated in a plan view in FIG. 4 of the drawings, a modified arrangement of the double finger structure of FIGS. 2 and 3 is used for the input and output transducers 9 and 10. As is illustrated in the drawings, the limbs of the bifurcated members 4 and 5 are connected together at their free ends by means of connecting links 11. Thus, with this arrangement, if one of the fingers is broken during production of the filter the remaining section of that finger will remain connected to the respective connecting member 6, 7 by means of the connecting link. The efficiency of the broken finger is, therefore, only impaired at the break itself. The use of the connecting links 11 ensures that the production yield for the acoustic surface wave filter arrangement of FIG. 4 is at least equal to the yield obtained with the structure of FIG. 1.

It should be noted that the connecting links 11 which can be of any desired shape and configuration, need not necessarily be located at the free ends of the limbs of the bifurcated members 4 and 5, the links 11 could, if desired, be situated between the bifurcated limbs of the members 4 and 5 at any position along the length thereof. Alternatively, more than one connecting link could be used between each pair of fingers.

An alternative arrangement for the interdigital transducers 9 and 10 of FIG. 4 which is also capable of suppressing the "triple echo" phenomenon is illustrated in a plan view in FIG. 5 of the drawings. With this arrangement only the members 4 are bifurcated and provided with connecting links 11.

The structure of FIG. 5 therefore provides three fingers per wavelength with a mark-to-space ratio of unity. Thus, in each wavelength there are two adjacent fingers of similar polarity and these fingers may be joined in any one of the ways outlined in a preceding paragraph for the transducer structures of FIG. 4 in order to maximise the production yield of the filters.

The technique outlined in the preceding paragraphs may also be used, in the manner illustrated in FIG. 6 of the drawings, to reduce reflections in an acoustic surface wave multistrip coupler.

It is to be understood that the foregoing description of specific examples of this invention is made by way of example only and is not to be considered as a limitation in its scope.

What is claimed is:

1. An acoustic surface wave filter which includes a strip member of a piezoelectric material having input and output interdigital transducers formed on a major surface thereof, each of the interdigital transducers including two interlaced rows of parallel spaced-apart elongated members, each of the elongated members of at least one of the rows being bifurcated to provide two parallel limbs, the limbs of each of the bifurcated members being connected together by means of at least one connecting link of a material different from the piezoelectric material of said strip member.

2. An acoustic surface wave filter as claimed in claim 1 wherein the free ends of the limbs of each of the bifurcated members are connected together by the connecting link.

3. An acoustic surface wave filter as claimed in claim 1 wherein the limbs of each of the bifurcated members are connected together by the connecting link at a position along the length thereof.

4. An acoustic surface wave filter as claimed in claim 1 wherein the piezoelectric material is quartz.

5. An acoustic surface wave filter as claimed in claim 1 wherein the limbs of each of said bifurcated members are conductively connected together by means of at least one connecting link of an electrically conductive material.

6. An acoustic surface wave filter as claimed in claim 1 wherein the elongated members of each of the rows are bifurcated to provide two parallel limbs.

7. An acoustic surface wave filter as claimed in claim 6 wherein the limbs of each of the bifurcated members are connected together by the connecting link at a position along the length thereof.

8. An acoustic surface wave filter as claimed in claim 6 wherein the free ends of the limbs of each of the bifurcated members are connected together by the connecting link.

* * * * *